(12) United States Patent
Guo et al.

(10) Patent No.: US 12,408,532 B2
(45) Date of Patent: Sep. 2, 2025

(54) DISPLAY PANEL AND DISPLAY DEVICE

(71) Applicant: Hubei Yangtze Industrial Innovation Center Of Advanced Display Co., Ltd., Wuhan (CN)

(72) Inventors: Linshan Guo, Wuhan (CN); Yu Cai, Wuhan (CN); Ping An, Shanghai (CN)

(73) Assignee: Hubei Yangtze Industrial Innovation Center Of Advanced Display Co, Ltd., Wuhan (CN)

( * ) Notice: Subject to any disclaimer, the term of this patent is extended or adjusted under 35 U.S.C. 154(b) by 322 days.

(21) Appl. No.: 17/333,936

(22) Filed: May 28, 2021

(65) Prior Publication Data

US 2021/0288294 A1    Sep. 16, 2021

(30) Foreign Application Priority Data

Jan. 29, 2021   (CN) .......................... 202110130088.9

(51) Int. Cl.
| | |
|---|---|
| *H10K 59/38* | (2023.01) |
| *H10K 50/86* | (2023.01) |
| *H10K 59/124* | (2023.01) |
| *H10K 59/131* | (2023.01) |
| *H10K 59/80* | (2023.01) |

(52) U.S. Cl.
CPC .............. *H10K 59/38* (2023.02); *H10K 50/86* (2023.02); *H10K 59/124* (2023.02);
(Continued)

(58) Field of Classification Search
CPC .... H10K 50/86; H10K 50/865; H10K 50/844; H10K 50/826; H10K 50/818;
(Continued)

(56) References Cited

U.S. PATENT DOCUMENTS

| | | | |
|---|---|---|---|
| 2016/0322450 A1* | 11/2016 | Lee ................. | H10K 10/88 |
| 2017/0047390 A1* | 2/2017 | Lee ................. | H10K 59/131 |
| 2021/0335969 A1* | 10/2021 | Park ............... | H10K 59/126 |

FOREIGN PATENT DOCUMENTS

| | | |
|---|---|---|
| CN | 109887985 A | 6/2019 |
| CN | 110161743 A | 8/2019 |

(Continued)

OTHER PUBLICATIONS

State Intellectual Property Office of the People's Republic of China, Text of First Office Action mailed May 24, 2022, issued in Chinese Application No. 202110130088.9, filed Jan. 29, 2021, 14 pages.

(Continued)

*Primary Examiner* — Vongsavanh Sengdara
(74) *Attorney, Agent, or Firm* — CHRISTENSEN O'CONNOR JOHNSON KINDNESS PLLC

(57) ABSTRACT

A display panel and a display device are provided. In an embodiment, the display panel includes: a substrate; a plurality of metal parts disposed above the substrate; and a plurality of light-emitting elements disposed at a side of the plurality of metal parts facing away from the substrate, each of the plurality of light-emitting elements including a first electrode, a light-emitting portion, and a second electrode stacked in sequence in a light-exiting direction of the display panel. In an embodiment, an orthographic projection of each of the plurality of metal parts on the substrate covers an orthographic projection of a respective one first electrode on the substrate. In an embodiment, the first electrode has a relatively flat surface, so the probability of mutual interference between the ambient light reflected by the first electrode is reduced, which can alleviate color dispersion of the display panel in a dark state.

19 Claims, 8 Drawing Sheets

(52) U.S. Cl.
CPC ..... *H10K 59/131* (2023.02); *H10K 59/80518* (2023.02); *H10K 59/873* (2023.02); *H10K 59/878* (2023.02); *H10K 59/8791* (2023.02); *H10K 59/8792* (2023.02); *H10K 59/80524* (2023.02)

(58) Field of Classification Search
CPC .... H10K 50/856; H10K 59/123; H10K 59/38; H10K 59/131; H10K 59/1213; H10K 59/122; H10K 59/124
See application file for complete search history.

(56) References Cited

FOREIGN PATENT DOCUMENTS

| | | | |
|---|---|---|---|
| CN | 111048570 A | 4/2020 | |
| CN | 111210732 A | 5/2020 | |
| CN | 112038498 A | 12/2020 | |
| CN | 112885874 A | 6/2021 | |

OTHER PUBLICATIONS

First Chinese Office Action mailed on Mar. 28, 2025, issued in Chinese Application No. 202211368836.8; 20 pages.
First Chinese Office Action mailed on Mar. 19, 2025, issued in Chinese App. No. 202211368678.6; 13 pages.
First Chinese Office Action mailed on Mar. 10, 2025, issued in Chinese App. No. 202211368684.4; 15 pages.

* cited by examiner

DISPLAY PANEL AND DISPLAY DEVICE

CROSS-REFERENCE TO RELATED APPLICATIONS

The present application claims priority to Chinese Patent Application No. 202110130088.9, filed on Jan. 29, 2021, the content of which is incorporated herein by reference in its entirety.

TECHNICAL FIELD

The present disclosure relates to the field of display technology, and in particular, to a display panel and a display device.

BACKGROUND

An Organic Light-emitting Diode (OLED) is conventionally used as a light-emitting element in an organic light-emitting display device, and the OLED has the characteristic of self-luminance and, thus, an additional light source is not required. Such an arrangement is conducive to an overall thinness of the display device and can achieve formation of a flexible display screen. In addition, organic self-luminous display technology also has the characteristics of a fast response speed and a wide viewing angle, and, thus, has become the focus of current research.

Current organic light-emitting display panels have observable color dispersion under ambient light, which affects an appearance quality of the display panel.

SUMMARY

The present disclosure provides a display panel and a display device, aiming to solve or mitigate the problem of color dispersion of the display panel under ambient light and improve the appearance quality of products.

An embodiment of the present disclosure provides a display panel, including: a substrate; a metal part disposed above the substrate; and a plurality of light-emitting elements disposed on one side of the metal part facing away from the substrate, the light-emitting element including a first electrode, a light-emitting portion, and a second electrode stacked in sequence in a light-exiting direction of the display panel. In an embodiment, an orthographic projection of the metal part on the substrate covers an orthographic projection of the first electrode on the substrate.

Another embodiment of the present disclosure provides a display device, including the display panel described above.

In certain embodiments, the display panel and the display device according to the embodiments of the present disclosure have following beneficial effects.

In an embodiment, the orthographic projection of the metal part disposed directly below the light-emitting element on the substrate covers an orthographic projection of the first electrode on the substrate, so the first electrode is disposed directly above a region corresponding to the metal part. In the formation of the display panel, the metal part can provide a relatively flat base for the formation of the first electrode, so that the first electrode produced has a relatively flat surface. That is, in the display panel according to the embodiments of the present disclosure, the first electrode has a relatively flat surface, and then the probability of mutual interference between the ambient light reflected by the first electrode is reduced. Such an arrangement can alleviate color dispersion of the display panel in a dark state and improve the appearance quality. At the same time, the relatively flat first electrode can also reduce a color difference of colors in a pixel light-emitting region at different viewing angles, alleviate the problem of color deviation at large viewing angles of the display panel, and improve the display effect.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. It should be noted that the drawings described as follows are merely part of the embodiments of the present disclosure, and other drawings can also be acquired by those skilled in the art without paying creative efforts.

DETAILED DESCRIPTION

In order to make the purpose, technical solutions, and advantages of the embodiments of the present disclosure be understandable, the technical solutions in the embodiments of the present disclosure are described in the following with reference to the accompanying drawings. It should be understood that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

Figure 1:
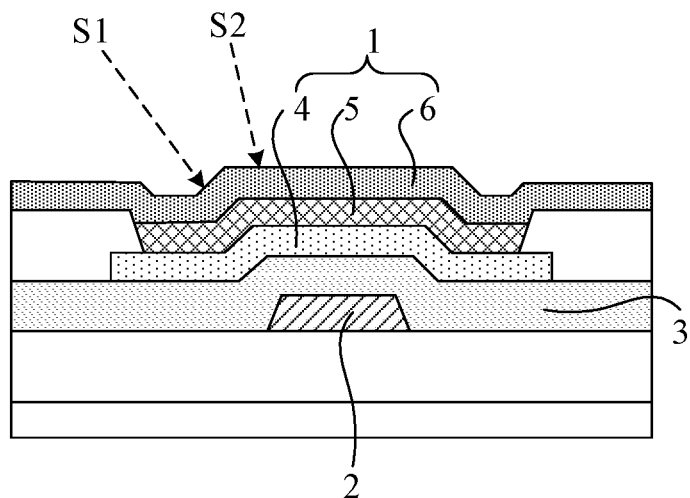
FIG. 1 is a simplified schematic cross-sectional diagram of a conventional display panel.

FIG. 1 is a simplified schematic cross-sectional diagram of a conventional display panel. As shown in FIG. 1, a signal line 2 is arranged directly below a light-emitting element 1. Since the signal line 2 has a certain width and thickness, an insulating layer 3 disposed above the signal line 2 cannot have a flat surface. As a result, an anode 4 of the light-emitting element 1 disposed directly above a position corresponding to the signal line 2 is not flat, and then the anode 4 has a non-flat surface. The non-flat surface of the anode 4 also leads to a non-flat surface of a light-emitting portion 5 and a non-flat surface of a cathode 6 disposed above the anode 4. The anode 4 in the light-emitting portion 1 is generally a reflective anode, and the anode 4 has high reflectivity to light. Ambient light passing through a partial film of the display panel may be reflected by the anode 4, and light reflected at different positions of the non-flat anode 4 may interfere with each other to cause color separation and dispersion. Especially when the display panel is in a dark state, color dispersion caused by reflection of ambient light by the non-flat anode 4 may be quite evident, thereby seriously affecting the appearance quality of the product. In addition, the non-flat surface of the anode 4 may also cause a great color change of the display panel at different viewing angles. As shown in the figure, the color of a pixel light-emitting region at a viewing angle S1 is different from that at a viewing angle S2. That is, the non-flatness surface of the anode 4 leads to a problem of color deviation at large viewing angles of the display panel, which affects the display effect.

Based on the problems associated with certain conventional displays, an embodiment of the present disclosure provides a display panel, a large-area metal part is provided below the light-emitting element, so that a first electrode of the light-emitting element close to the metal part is disposed on a relatively flat surface, so as to alleviate the color dispersion caused by reflection of the ambient light by the display panel, thereby improving the appearance quality of the product. At the same time, it alleviates the problem of color deviation at large viewing angles of the display panel and improving the display effect.

Figure 2:
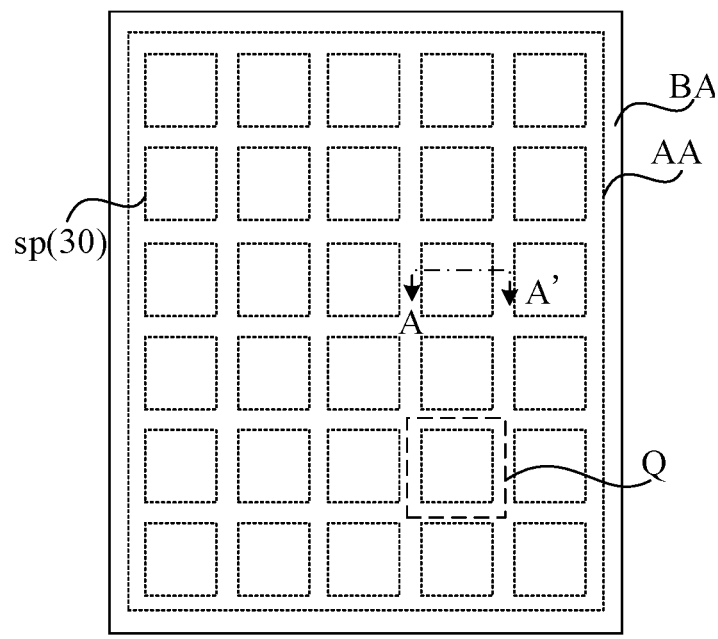
FIG. 2 is a schematic diagram of a display panel, according to an embodiment of the present disclosure.
Figure 3:
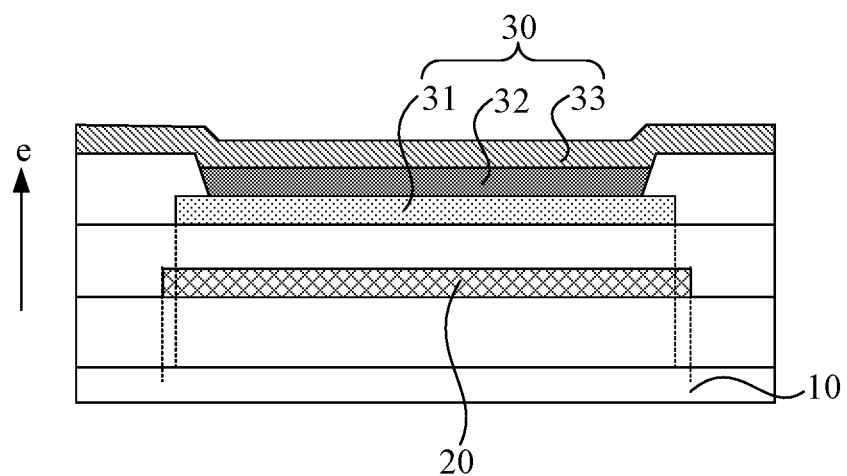
FIG. 3 is a schematic cross-sectional diagram along a line A-A' shown in FIG. 2, according to an embodiment of the present disclosure.
Figure 4:
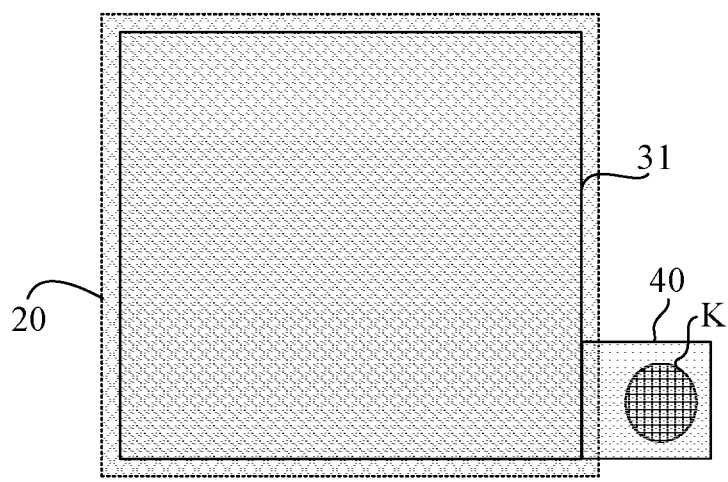
FIG. 4 is a schematic top view of a region Q shown in FIG. 2, according to an embodiment of the present disclosure.

FIG. 2 is a schematic diagram of a display panel according to an embodiment of the present disclosure, FIG. 3 is a schematic cross-sectional diagram along a line A-A' shown in FIG. 2, and FIG. 4 is a schematic top view of a region Q shown in FIG. 2.

As shown in FIG. 2, the display panel has a display region AA and a non-display region BA. The non-display region BA surrounds the display region AA. The display region AA is provided with a plurality of sub-pixels sp, each of which includes a respective light-emitting element 30. The plurality of sub-pixels sp include red sub-pixels, green sub-pixels and blue sub-pixels. The shape of the display panel illustrated in the figure is merely schematic, and does not constitute a limitation on the present disclosure.

For example, FIG. 3 illustrates only a part of the structure of the display panel in a simplified way. As shown in FIG. 3, the display panel includes: a substrate 10, a metal part 20, and a plurality of light-emitting elements 30 (only one light-emitting element 30 is shown in FIG. 3). The metal part 20 is disposed above the substrate 10, and the light-emitting element 30 is disposed at a side of the metal part 20 facing away from the substrate 10, that is, when the display panel is viewed at a front angle, the metal part 20 is disposed below the light-emitting element 30. The light-emitting element 30 includes a first electrode 31, a light-emitting portion 32, and a second electrode 33 stacked in sequence along a light-exiting in direction e of the display panel. During a forming process of the display panel, the metal part 20 is disposed above the substrate 10 and the light-emitting element 30 is formed after the formation process of the metal part 20. That is, the first electrode 31, the light-emitting portion 32, and the second electrode 33 are disposed in sequence above the metal part 20. For example, the first electrode 31 is a reflective electrode, and the second electrode 33 is a transparent electrode. The light-exiting direction of the light-emitting element 30 is a direction from the first electrode 31 to the second electrode 33. Part of light emitted from the light-emitting portion 32 is directly directed to the second electrode 33 and then passes through the second electrode 33, and part of light emitted from the light-emitting portion 32 to the first electrode 31 can be reflected by the first electrode 31 and then is directed to the second electrode 33 and passes through the second electrode 33, so as to achieve the light emission efficiency of the light-emitting element 30.

In one embodiment, the first electrode 31 is a reflective anode, and the second electrode 33 is a transparent cathode. The display panel further includes a pixel circuit (not shown in FIG. 3) disposed above the substrate 10. The pixel circuit is electrically connected to the light-emitting element 30 and is used to drive the light-emitting element 30 to emit light.

In the present disclosure, an orthographic projection of the metal part 20 on the substrate 10 covers an orthographic projection of the first electrode 31 on the substrate 10.

The top view as shown in FIG. 4 shows the first electrode 31 of the light-emitting element 30 and the metal part 20 and also shows a connecting electrode 40. In FIG. 4, shapes of the first electrode 31 and the metal part 20 are merely schematic. The connecting electrode 40 is electrically connected to the first electrode 31, and the connecting electrode 40 is connected to the pixel circuit via a through-hole K. In an embodiment, the connecting electrode 40 and the first electrode 31 are arranged in a same layer and comprise a same material. The connecting electrode 40 and the first electrode 31 are formed as an integrated structure. It is noted that projection directions in which the first electrode 31 and the metal part 20 are orthographically projected to the substrate 10 are the same as an overlooking direction in which the display panel is overlooked, and then in the top view, the first electrode 31 coincides with its orthographic projection on the substrate 10 and the metal part 20 coincides with its orthographic projection on the substrate 10. It can be seen from FIG. 4 that the orthographic projection of the metal part 20 on the substrate 10 covers the orthographic projection of the first electrode 31 on the substrate 10. In other words, the orthographic projection of the first electrode 31 on the substrate is within the orthographic projection of the metal part 20 on the substrate. The process for forming the first electrode 31 is after the process for forming the metal part 20, so the metal part 20 can provide a relatively flat base for the first electrode 31 when forming the first electrode 31 at a corresponding position directly above the metal part 20.

For example, the display panel further includes an encapsulation structure that is disposed at a side of the light-emitting element facing away from the substrate and covers and surrounds the plurality of light-emitting elements. The encapsulation structure is used to isolate water and oxygen to protect the light-emitting portion of the light-emitting element and improve the service life of the light-emitting element.

In one embodiment, the encapsulation structure is thin film encapsulation structure, and the encapsulation structure includes at least one inorganic encapsulation layer and at least one organic encapsulation layer that are stacked. A display panel with certain flexibility can be formed with this implementation method.

In another embodiment, the encapsulation structure is rigid encapsulation structure, and the encapsulation structure includes encapsulation glass. The encapsulation glass is bonded to an array layer of the display panel by a sealant, to accommodate the plurality of light-emitting elements in a chamber formed by the encapsulation glass and the sealant. The array layer is formed above the substrate, and the array layer includes a pixel circuit.

In the display panel according to this embodiment of the present disclosure, the metal part 20 is directly below the light-emitting element 30, and an orthographic projection of the metal part 20 on the substrate 10 covers an orthographic projection of the first electrode 31 on the substrate 10. In the process for forming the display panel, the first electrode 31 is formed directly above a region corresponding to the metal part 20, and the metal part 20 can provide a relatively flat base for the formation of the first electrode 31, so that the formed first electrode 31 is relatively flat. That is, in the display panel according to this embodiment of the present disclosure, the first electrode 31 has a relatively flat surface, and then a probability of mutual interference between the ambient light reflected by the first electrode 31 is reduced. Such an arrangement can alleviate color dispersion of the display panel in a dark state, thereby improving the appearance quality. At the same time, the relatively flat first electrode 31 can also reduce a color difference of colors in a pixel light-emitting region at different viewing angles, thereby alleviating the problem of color deviation at large viewing angles of the display panel and improving the display effect.

In this embodiment of the present disclosure, the pixel circuit is disposed above the substrate 10 and disposed below the light-emitting element 30, and the pixel circuit includes a plurality of thin film transistors. In one embodiment, an active layer of the thin-film transistor in the pixel circuit includes silicon, and the thin-film transistor is a cryogenic polysilicon transistor. In another embodiment, an active layer of a drive transistor in the pixel circuit includes silicon, and an active layer of each of a part of switch transistors in the pixel circuit includes metal oxides. In use, light emitted from the light-emitting element 30 may be reflected and refracted and then directed to the thin film transistor below. In addition, ambient light may pass through a part of a film structure of the display panel through the region between adjacent light-emitting elements 30, and then be directed to the thin film transistor below. The active layer of the thin film transistor is sensitive to light. The active layer may generate a light leakage current when receiving light, which may lead to changes in characteristics of the thin-film transistors and then affect the pixel circuit to drive the light-emitting element to emit light, resulting in non-uniform display of the display panel. Based on this, in an embodiment of the present disclosure, the structure of the display panel is further designed to prevent influence of light on transistor devices in the pixel circuit.

Figure 5:
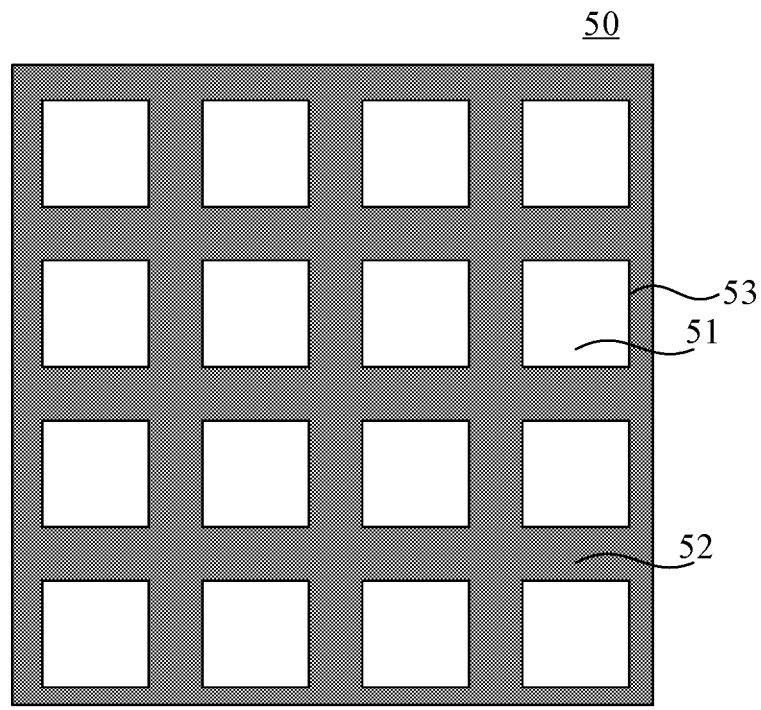
FIG. 5 is a schematic partial top view of a color filter layer in another display panel, according to an embodiment of the present disclosure.

In some embodiments, a color filter layer is arranged above the light-emitting element. The color filter layer includes a plurality of filter units and a light-blocking part. The light-blocking part can block a region between adjacent light-emitting elements, thereby preventing ambient light from being directed to the pixel circuit below through the region between adjacent light-emitting elements. At the same time, the color filter layer can also reduce reflection of ambient light by the display panel. For example, FIG. 5 is a schematic partial top view of a color filter layer in another display panel according to an embodiment of the present disclosure. As shown in FIG. 5, a color filter layer 50 includes a plurality of filter units 51 and a light-blocking part 52. The light-blocking part 52 defines a plurality of first apertures 53, and a projection of the filter unit 51 in a plane where the light-blocking part 52 is disposed covers the first aperture 53. In FIG. 5, the shape of the first aperture 53 is merely schematic. In the display panel, each sub-pixel corresponds to a respective first aperture 53. The first aperture 53 overlaps with the light-emitting element, and the shape of the first aperture 53 is the same as the shape of the light-emitting portion 32 in the light-emitting element 30. For example, the filter unit 51 includes a red filter unit, a green filter unit, and a blue filter unit. A red sub-pixel corresponds to the red filter unit, a green sub-pixel corresponds to the green filter unit, and a blue sub-pixel corresponds to the blue filter unit.

Figure 6:
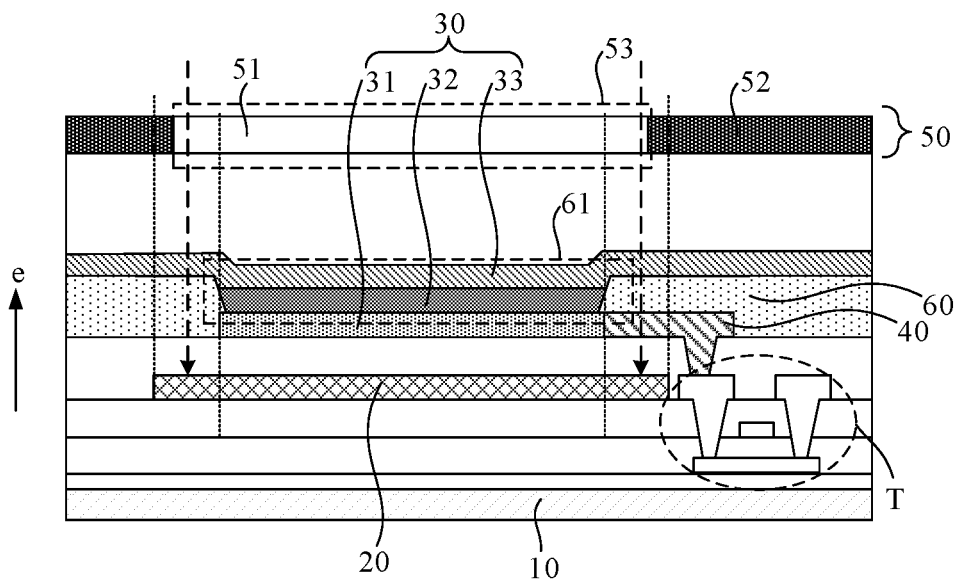
FIG. 6 is another schematic cross-sectional diagram along a line A-A' shown in FIG. 2, according to an embodiment of the present disclosure.

In one embodiment, FIG. 6 is another schematic cross-sectional diagram along a line A-A' shown in FIG. 2. As shown in FIG. 6, the color filter layer 50 is disposed at a side of the light-emitting element 30 facing away from the substrate 10. In the light-exiting direction e of the display panel, the first aperture 53 overlaps with the light-emitting element 30, and a projection of the metal part 20 on the color filter layer 50 covers the first aperture 53. A pixel defining layer 60 is illustrated in FIG. 6. The pixel defining layer 60 is used to separate adjacent light-emitting elements 30 from one another. The pixel defining layer 60 includes second apertures 61. Each light-emitting element 30 corresponds to a respective second aperture 61. The second aperture 61 exposes the first electrode 31, and the light-emitting portion 32 is disposed in the first aperture 61. A transistor T in the pixel circuit is illustrated in the figure. The first electrode 31 is electrically connected to the transistor T through the connecting electrode 40. The transistor T includes a gate, a source, a drain, and an active layer, wherein the first electrode 31 is electrically connected to the drain of the transistor T via a through-hole of the insulating layer.

In this embodiment, an orthographic projection of the metal part 20 on the substrate 10 covers an orthographic projection of the first electrode 31 on the substrate 10, and in the process for forming the display panel, the metal part 20 can provide a relatively flat base for the formation of the first electrode 31, so that the formed first electrode 31 has a relatively flat surface. Accordingly, a probability of mutual interference between the ambient light reflected by the first electrode 31 is reduced, color dispersion of the display panel in a dark state is alleviated, and the appearance quality is improved. At the same time, a color difference of colors in a pixel light-emitting region at different viewing angles can also be reduced, and the problem of color deviation at large viewing angles of the display panel is alleviated. A color filter layer is arranged at a side of the light-emitting element 30 facing away from the substrate 10. The filter unit 51 in the color filter layer 50 can transmit visible light in a specific wavelength range. For example, the red filter unit can transmit red light, the green filter unit can transmit green light, and the blue filter unit can transmit blue light. That is, the filter unit 51 can prevent transmission of light in other wavelength ranges except the specific wavelength range, and can reduce the amount of ambient light into the display panel, thus reducing reflection of ambient light by the first electrode 31, namely, the reflection of ambient light by the display panel. Moreover, when light passing through the filter unit 51 of a certain color is reflected by the first electrode 31 of the light-emitting element 30 which overlaps with the filter unit 51 and then is directed to the filter unit of another color, the light cannot pass through the filter unit 51 of the other color and exit from the display panel, which can also reduce reflection of ambient light by the display panel. Therefore, the color filter layer 50 arranged above the light-emitting element 30 can reduce reflection of ambient light by the display panel.

For example, in the embodiment of FIG. 6, the pixel defining layer 60 comprises an organic material which transmits light, that is, material of the pixel defining layer 60 includes a light-transmitting material. Then the region between adjacent light-emitting elements 30 has a particular light transmittance. In the light-exiting direction of the display panel, the light-blocking part 52 in the color filter layer 50 overlaps with the pixel defining layer 60, and the light-blocking part 52 can block the light and prevent the light from passing through the pixel defining layer 60 and then being directed to the transistor device below. Moreover, in the embodiment of FIG. 6, a projection of the metal part 20 on the color filter layer 50 covers the first aperture 53, then light (as indicated by the dashed arrow in the figure) that exits from the first aperture 53 to the pixel circuit below can be blocked by the metal part 20, and the metal part 20 can prevent light from being directed to the transistor device below, thereby reducing the risk of non-uniform display of the display panel.

Further, the material for forming the metal part 20 includes a light-absorbing material, so that the metal part 20 can absorb the light that reaches the metal part 20. Correspondingly, the metal part 20 is less reflective to light. That is, the reflection of light by the metal part 20 can be reduced, the reflection of light by the display panel can be further reduced, and the display effect of the display panel is improved.

In the display panel, the first electrode 31 of the light-emitting element 30 is a reflective electrode, and the reflectivity of the first electrode 31 to light is greater than the reflectivity of the metal part 20 to light. For example, in the light-exiting direction e of the display panel, the first aperture 53 overlaps with the light-emitting element 30. On the premise that the light emitted from the light-emitting element 30 can exit from the first aperture 53 and has a light-exiting angle in a certain range, in the light-exiting direction e of the display panel, a projection of the first electrode 31 on the color filter layer 50 is disposed in the first aperture 53. In other words, an area of the first electrode 31 is smaller than an area of the first aperture 53. Light that passes through the first aperture 53 can be blocked by the metal part 20 below the first electrode 31, and the area of the first electrode 31 does not need to be too large, which can avoid increasing of reflection of ambient light by the display panel caused by an excessively-large area of the first electrode 31 with high light reflectivity to light.

Figure 7:
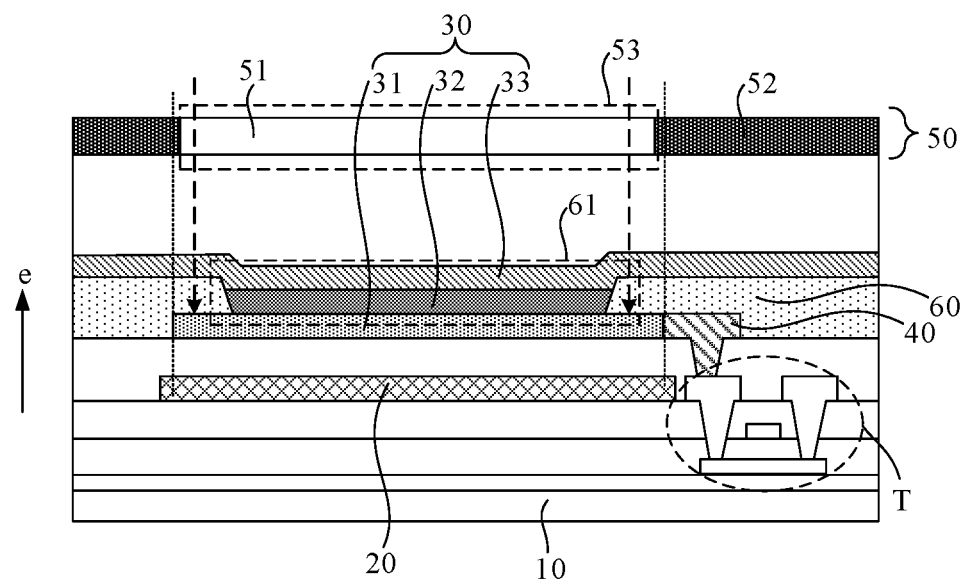
FIG. 7 is another schematic cross-sectional diagram along a line A-A' shown in FIG. 2, according to an embodiment of the present disclosure.

In another embodiment, FIG. 7 is another schematic cross-sectional diagram of a line A-A' shown in FIG. 2. As shown in FIG. 7, the display panel further includes a color filter layer 50 disposed at a side of the light-emitting element 30 facing away from the substrate 10. The color filter layer 50 includes a plurality of filter units 51 (only one filter unit 51 is shown in the figure) and a light-blocking part 52. The light-blocking part 52 defines a plurality of first apertures 53 (only one first aperture 53 is shown in the figure). A projection of the filter unit 51 on the light-blocking part 52 covers the first aperture 53. In the light-exiting direction e of the display panel, the first aperture 53 overlaps with the light-emitting element 30, and an orthographic projection of the first electrode 31 on the color filter layer 50 covers the first aperture 53. A pixel defining layer 60 is further shown in the figure. The pixel defining layer 60 is used to separate adjacent light-emitting elements 30 from one another. The pixel defining layer 60 includes second apertures 61, and each light-emitting element 30 corresponds to a respective second aperture 61. The second aperture 61 exposes the first electrode 31, and the light-emitting portion 32 is disposed in the first aperture 61. The material for forming the pixel defining layer 60 includes a light-transmitting material.

In this embodiment, an orthographic projection of the metal part 20 on the substrate 10 covers an orthographic projection of the first electrode 31 on the substrate 10. In the formation of the display panel, the metal part 20 can provide a relatively flat base for the formation of the first electrode 31, to form a relatively flat first electrode 31. The first electrode 31 has a relatively flat surface, so that the probability of mutual interference between the ambient light reflected by the first electrode 31 is reduced, color dispersion of the display panel in a dark state is alleviated, and the appearance quality is improved. At the same time, a color difference of colors in a pixel light-emitting region at different viewing angles can also be reduced, and the problem of color deviation at large viewing angles of the display panel is alleviated. Meanwhile, the color filter film 50 above the light-emitting element 30 can reduce the reflection of ambient light by the display panel, and the light-blocking part 52 in the color filter layer 50 can block the region between adjacent light-emitting elements 30 to prevent the light from passing through the pixel defining layer 60 and then being directed to the transistor device below. Further, an orthographic projection of the first electrode 31 on the color filter layer 50 covers the first aperture 53, so that light (as indicated by the dashed arrow in the figure) that is directed to the pixel circuit below through the first aperture 53 can be blocked by the first electrode 31, and the first electrode 31 can further prevent light from being directed to the transistor device below, thereby reducing the risk of non-uniform display of the display panel.

In some embodiments, the material of the pixel defining layer in the display panel includes a light-blocking material, then the pixel defining layer between adjacent light-emitting elements can block the light to some extent, preventing the light from passing through the pixel defining layer and then being directed to the pixel circuit below, so as to reduce the risk of non-uniform display of the display panel. At the same time, the pixel defining layer can also prevent light crosstalk between adjacent light-emitting elements. In addition, in order to allow that users have good use experience, the display panel needs to have a large viewing angle, and a light-exiting angle of the light-emitting element needs to be within a certain range. Then, a side wall of the second aperture the corresponding pixel defining layer is at a non-right angle with a plane where the substrate is disposed. That is, a distance between the side wall of the second aperture and the substrate varies gradually in a direction from the center of the second aperture to an edge. There is still a certain transmittance at the position of the side wall of the second aperture, and the light can penetrate the side wall of the second aperture and then be emitted to the pixel circuit below. Based on this, the present disclosure continues to improve the structure of the display panel to solve the above problems.

Figure 8:
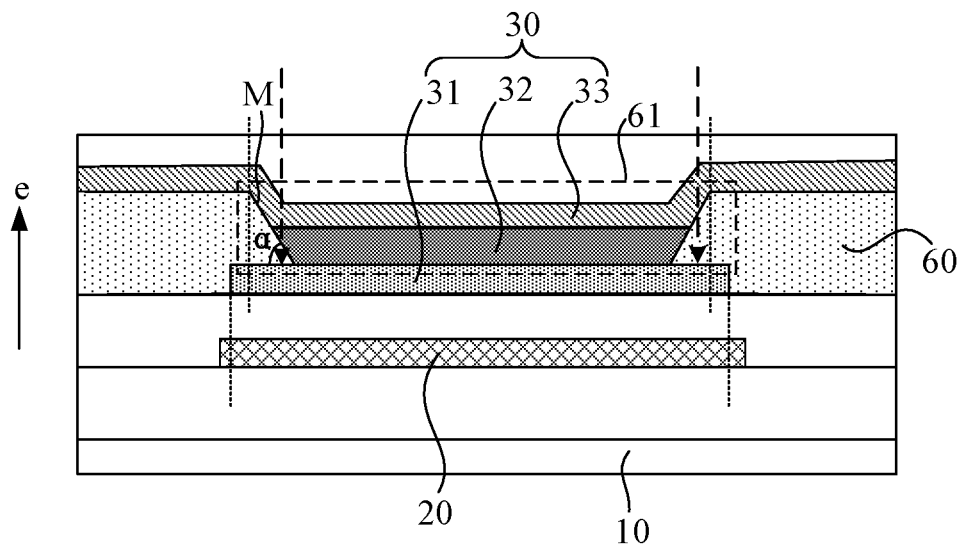
FIG. 8 is another schematic cross-sectional diagram along a line A-A' shown in FIG. 2, according to an embodiment of the present disclosure.

For example, in one embodiment, FIG. 8 is another schematic cross-sectional diagram along a line A-A' shown in FIG. 2. As shown in FIG. 8, the pixel defining layer 60 includes a plurality of second apertures 61. The second aperture 61 exposes the first electrode 31, and the light-emitting portion 32 is disposed in the second aperture 61. The Material for forming the pixel defining layer 61 includes a light-blocking material. As shown in the figure, a non-right angle α is formed between a side wall M of the second aperture 61 and a plane where the substrate 10 is disposed. That is, the side wall M of the second aperture 61 is an inclined side wall. An orthographic projection of the first electrode 31 on the substrate 10 covers an orthographic projection of the side wall M on the substrate 10. A pixel circuit for driving the light-emitting element 30 is provided above the substrate 10. The pixel circuit is not shown in the figure.

In this embodiment, an orthographic projection of the metal part 20 on the substrate 10 covers an orthographic projection of the first electrode 31 on the substrate 10. In the formation of the display panel, the metal part 20 can provide a relatively flat base for the formation of the first electrode 31, so that the formed first electrode 31 has a relatively flat surface. Accordingly, the probability of mutual interference between the ambient light reflected by the first electrode 31 is reduced, and color dispersion of the display panel in a dark state is alleviated. At the same time, the relatively flat first electrode 31 can also reduce a color difference of colors in a pixel light-emitting region at different viewing angles, and alleviate the problem of color deviation at large viewing angles of the display panel. In addition, the first electrode 31 can block light (as indicated by the dashed arrow in the figure) passing through the side wall M of the second aperture 61, preventing light from being directed from the side wall M of the second aperture 61 to the transistor device below, thereby reducing the risk of non-uniform display of the display panel.

Figure 9:
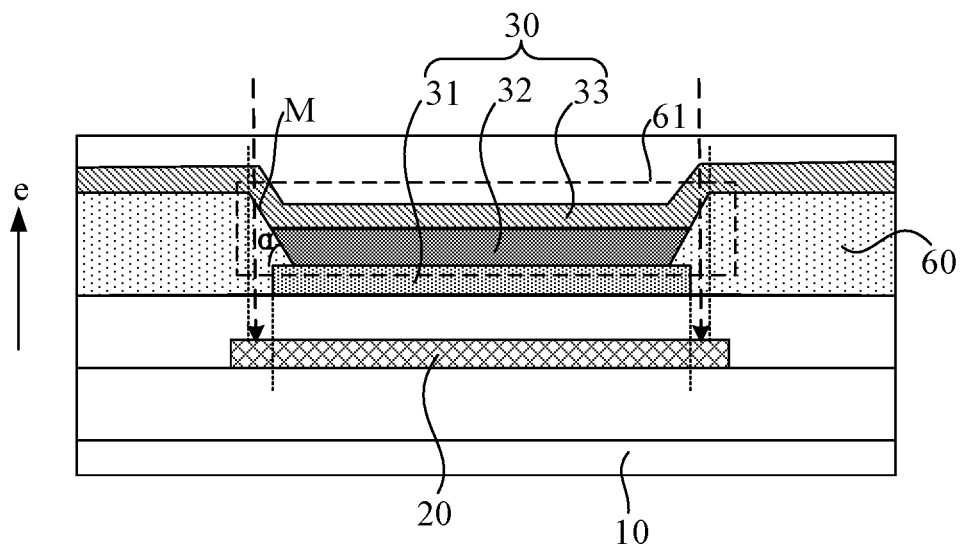
FIG. 9 is another schematic cross-sectional diagram along a line A-A' shown in FIG. 2, according to an embodiment of the present disclosure.

For example, in another embodiment, FIG. 9 is another schematic cross-sectional diagram along a line A-A' shown in FIG. 2. As shown in FIG. 9, a non-right angle α is formed between a side wall M of the second aperture 61 of the pixel defining layer 60 and a plane where the substrate 10 is disposed; and an orthographic projection of the metal part 20 on the substrate 10 covers an orthographic projection of the side wall M on the substrate 10. In this embodiment, an orthographic projection of the metal part 20 on the substrate 10 covers an orthographic projection of the first electrode 31 on the substrate 10, so that the formed first electrode 31 has a relatively flat surface. The probability of mutual interference between the ambient light reflected by the first electrode 31 is reduced, and color dispersion of the display panel in a dark state is alleviated. At the same time, the relatively flat first electrode 31 can also reduce a color difference of colors in a pixel light-emitting region at different viewing angles, and alleviate the problem of color deviation at large viewing angles of the display panel. In addition, the metal part 20 can block light (as indicated by the dashed arrow in the figure) passing through the side wall M of the second aperture 61, preventing the light from being directed from the side wall M of the second aperture 61 to the transistor device below, thereby reducing the risk of non-uniform display of the display panel.

In addition, the display panel in the embodiments of FIG. 8 and FIG. 9 may further include an anti-reflection layer disposed at a side of the light-emitting element facing away from the substrate. The anti-reflection layer is used to reduce reflection of ambient light by the display panel, so as to improve the display effect of the display panel.

For example, the anti-reflection layer includes the color filter layer 50 shown in the embodiment of FIG. 5.

In one embodiment, the metal part 20 is not connected to an electric potential. That is, during the operation of the display panel, no voltage signal is transmitted on the metal part 20. For example, the metal part 20 and the functional structure in the display panel are disposed in a same layer and by a same material, but the metal part 20 does not reuse circuit elements (such as wiring or electrodes) in the pixel circuit. The provision of the metal part 20 can provide a relatively flat base for the formation of the light-emitting element 30, so that the formed first electrode 31 is relatively flat, which alleviates color dispersion of the display panel in a dark state and alleviates the problem of color deviation at large viewing angles of the display panel. Moreover, the provision of the metal part 20 does not change the design of the circuit elements in the pixel circuit, to prevent an increase in the complexity of the design of the pixel circuit caused by the influence of a large-area metal part 20 on the electrical performance of the circuit elements.

In one embodiment, the metal part 20 is reused as a signal line in the display panel. That is, during the operation of the display panel, no voltage signal is transmitted on the metal part 20. In the embodiment, the shape of the signal line directly below the light-emitting element 30 is changed to serve as the metal part 20. The design of the metal part 20 adds no additional structure to the display panel and has little influence on wiring of the pixel circuit.

Figure 10:
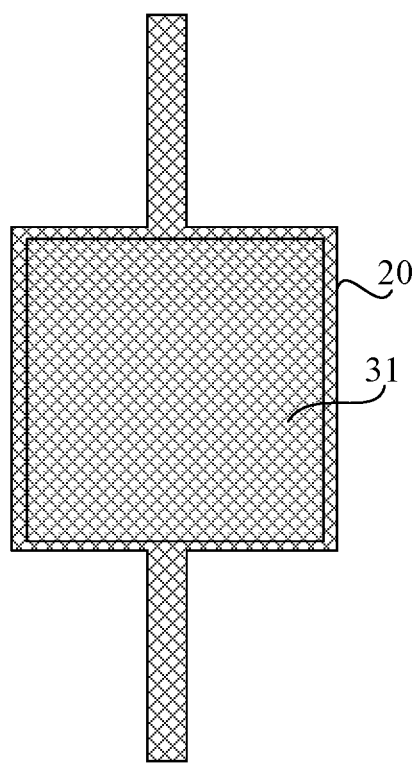
FIG. 10 is a first schematic diagram of a shape of a metal part and a first electrode, according to an embodiment of the present disclosure.
Figure 11:
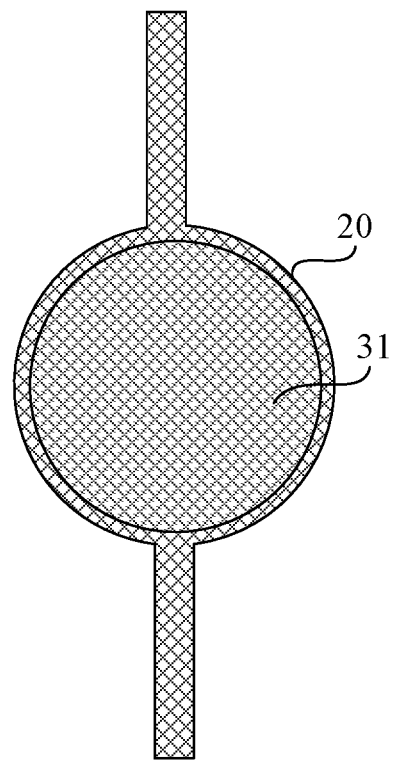
FIG. 11 is a second schematic diagram of a shape of a metal part and a first electrode, according to an embodiment of the present disclosure.

For example, the shape of the metal part 20 is the same as the shape of the first electrode 31. FIG. 10 is a first schematic diagram of a shape of a metal part and a first electrode according to an embodiment of the present disclosure, and FIG. 11 is a second schematic diagram of a shape of a metal part and a first electrode according to an embodiment of the present disclosure. Each of FIG. 10 and FIG. 11 is a schematic top view of a display panel, in which the first electrode 31 overlaps with the metal part 20 and the metal part 20 is reused as a signal line in the display panel, that is, the metal part 20 is part of the signal line.

As shown in FIG. 10, the first electrode 31 and the metal part 20 are both in a shape of a rectangle. As shown in FIG. 11, the first electrode 31 and the metal part 20 are both in a shape of a circle. The shape of the metal part 20 is set to be the same as the shape of the first electrode 31, so the area of the metal part 20 below the first electrode 31 does not need to be too large, which can avoid an influence of setting of the metal part 20 on other structures in the display panel. For example, the first electrode 31 needs to be connected to the pixel circuit below via a through-hole. First, the first electrode 31 is connected to the connecting electrode (as shown in FIG. 4 and FIG. 6), and then the connecting electrode is connected to the drain of the transistor via the through-hole of the insulating layer. By setting the shape of the metal part 20 to be the same as the shape of the first electrode 31, the area of the metal part 20 does not need to be too large, so as to avoid the occupation of a large space by the metal part 20, which can reduce an influence on connection of the connecting electrode to a through-hole of the transistor.

In this embodiment of the present disclosure, the first electrode 31 may also be in a shape of a regular polygon or in other shapes. In practice, the shape of the first electrode 31 may be designed according to specific requirements.

Figure 12:
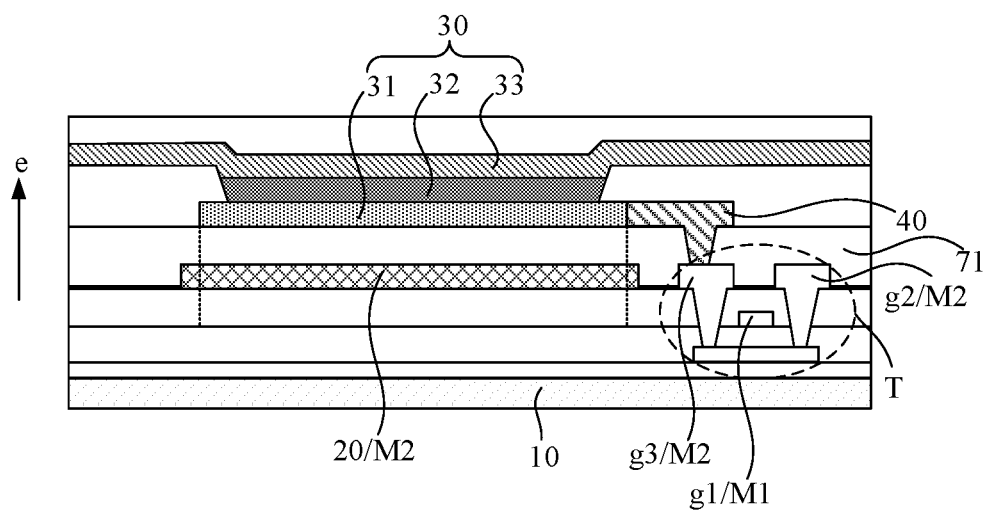
FIG. 12 is a schematic cross-sectional diagram of another display panel, according to an embodiment of the present disclosure.

In one embodiment, FIG. 12 is a schematic cross-sectional diagram of another display panel according to an embodiment of the present disclosure. As shown in FIG. 12, the display panel further includes a first metal layer M1 and a second metal layer M2 disposed above the substrate 10. A thickness of the second metal layer M2 is greater than or equal to that of the first metal layer M1. The metal part 20 is disposed in the second metal layer M2. A thicker metal layer indicates greater influence of the structure defined by the metal layer on the flatness of the first electrode 31 formed subsequently. In this embodiment, the metal part 20 is disposed in a thicker metal layer. The metal part 20 defines a large area so that an orthographic projection of the metal part 20 on the substrate 10 covers an orthographic projection of the first electrode 31 on the substrate 10. Then, the metal part 20 can provide a relatively flat base for the formation of the first electrode 31. In this embodiment of the present disclosure, the first electrode 31 has better flatness, which can alleviate color dispersion of the display panel in a dark state, improve the appearance quality of the product, and at the same time, alleviate the problem of color deviation at large viewing angles of the display panel.

For example, as shown in FIG. 12, the transistor T in the pixel circuit includes a gate g1, a source g2, and a drain g3. The first electrode 31 of the light-emitting element 30 is connected to the drain g3. The metal part 20 is in the same layer as the source g2 and the drain g3, that is, the source g2 and the drain g3 are disposed in the second metal layer M2. In an embodiment, the material forming the second metal layer includes titanium/aluminum/titanium. The material for forming the first metal layer includes molybdenum.

In some embodiments, the display panel includes at least two metal layers disposed between the substrate 10 and the light-emitting element 30, wherein the metal part 20 is disposed in the metal layer closest to the light-emitting element 30 in the light-exiting direction of the display panel. In this embodiment, the metal part 20 is disposed in the metal layer closest to the light-emitting element 30 above the substrate 10. That is, there is no other metal layer process after the process of the metal part 20 and before the formation of the first electrode of light-emitting element 30. No other metal structure above the metal part 20 affects the flatness of the substrate below the first electrode 31. After the insulating layer is formed on the metal part 20, a relatively flat base can be provided for the formation of the first electrode 31, so that the flatness of the formed first electrode 31 is better, that is, the first electrode 31 in this embodiment of the present disclosure has better flatness. Then the probability of mutual interference between the ambient light reflected by the first electrode 31 is reduced, which can alleviate color dispersion of the display panel in a dark state. At the same time, the relatively flat first electrode 31 can also reduce a color difference of colors in a pixel light-emitting region at different viewing angles, alleviate the problem of color deviation at large viewing angles of the display panel, and improve the display effect.

For example, the display panel further includes an organic insulating layer. As shown in FIG. 12, the organic insulating layer 71 is in contact with the metal part 20 and covers the metal part 20. The organic insulating layer 71 is a planarization layer. This embodiment indicates that the metal part 20 is in the same layer as the source g2 and the drain g3, that is, the metal part 20 is formed in the same process as the source g2 and the drain g3. The organic insulating layer 71 is formed after the process of the source and the drain, so that the organic insulating layer 71 contacts and covers the metal part 30. At the same time, the organic insulating layer 71 is etched to form a through-hole (not marked in the figure) to expose the drain g2. During the formation of the first electrode 31, the first electrode 31 is formed directly above the metal part 20, and a surface of the organic insulating layer 71 formed above the large-area metal part 20 is also relatively flat, which can provide a relatively flat base for the first electrode 31, so that the flatness of the formed first electrode 31 is better. That is, in this embodiment of the present disclosure, the first electrode 31 has better flatness. Then the probability of mutual interference between the ambient light reflected by the first electrode 31 is reduced, which can alleviate color dispersion of the display panel in a dark state. At the same time, the relatively flat first electrode 31 can also reduce a color difference of colors in a pixel light-emitting region at different viewing angles, alleviate the problem of color deviation at large viewing angles of the display panel, and improve the display effect. In addition, during the formation of the first electrode 31, the connecting electrode 40 is formed in the same process. The connecting electrode 40 is connected to the first electrode 31, and the connecting electrode 40 is connected to the drain g3 below via the through-hole, to achieve an electrical connection between the first electrode 31 and the transistor in the pixel circuit.

Figure 13:
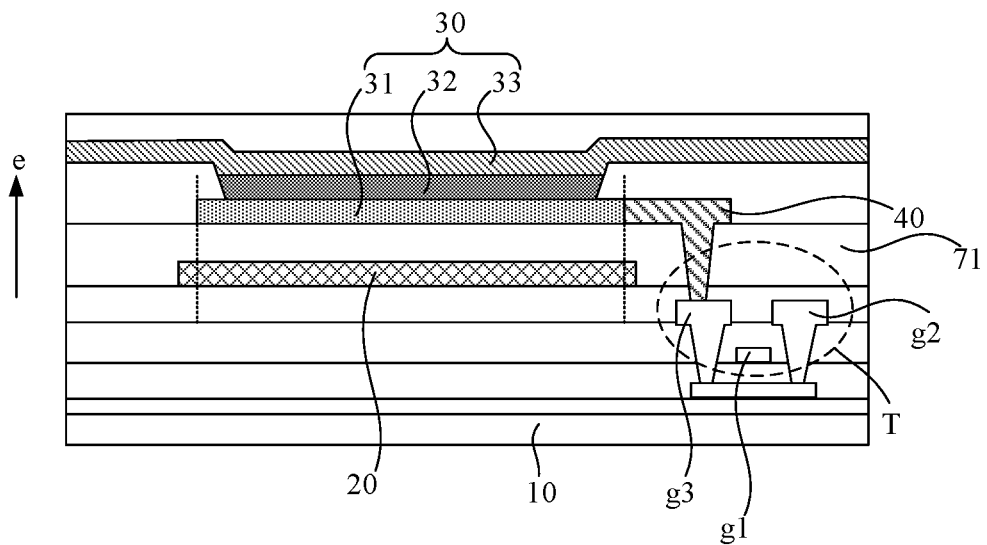
FIG. 13 is a schematic cross-sectional diagram of another display panel, according to an embodiment of the present disclosure.

In another embodiment, FIG. 13 is a schematic cross-sectional diagram of another display panel according to an embodiment of the present disclosure. As shown in FIG. 13, the organic insulating layer 71 is in contact with the metal part 20 and covers the metal part 30. In this embodiment, an insulating layer (not marked) is provided between the metal part 30 and the source and the drain of the transistor T. That is, the metal part 30 and the source and the drain are disposed in different metal layers. During the formation of the display panel, after the process of the source g2 and the drain g3, a whole-surface insulating layer is formed, and then the insulating layer is etched to form a through-hole to expose the drain g3. Then, the metal part 30 is formed above the insulating layer. Then a whole-surface organic insulating layer 71 is formed above the metal part 30. The organic insulating layer 71 has functions of insulation and planarization. Then, the organic insulating layer 71 is etched to form a through-hole to expose the drain g3. That is, the through-hole of the insulating layer and the through-hole of the organic insulating layer 71 above the drain g3 are interconnected to expose the drain g3. Then, the first electrode 31 is formed above the organic insulating layer 71. The first electrode 31 is formed above the metal part 20. The surface of the organic insulating layer 71 formed above the large-area metal part 20 is also relatively flat, so as to provide a relatively flat base for the first electrode 31, so that the flatness of the formed first electrode 31 is better, which can alleviate color dispersion of the display panel in a dark state, and can also alleviate the problem of color deviation at large viewing angles of the display panel. Similarly, during the formation of the first electrode 31, the connecting electrode 40 is formed in the same process. The connecting electrode 40 is connected to the first electrode 31, and the connecting electrode 40 is connected to the drain g3 below via the through-hole.

In the embodiment of FIG. 13, the metal part 20 is formed in a metal layer above the source and the drain. The metal layer where the metal part 20 is disposed is a metal layer closest to the light-emitting element 30. In one embodiment, the metal part 20 is connected not connected to an electric potential during the operation of the display panel.

In another embodiment, the metal part 20 is configured for further or additional use as a signal line in the display panel. For example, the metal part 20 is electrically connected to a positive power supply signal line in the display panel. The positive power supply signal line is used to provide a constant positive voltage signal for the pixel circuit during the operation of the pixel circuit. The metal part 20 is electrically connected to the positive power supply signal line, which can reduce the overall resistance of the positive power supply signal line, thereby reducing the voltage drop loss on the positive power supply signal line and reducing the power consumption of the display panel.

Figure 14:
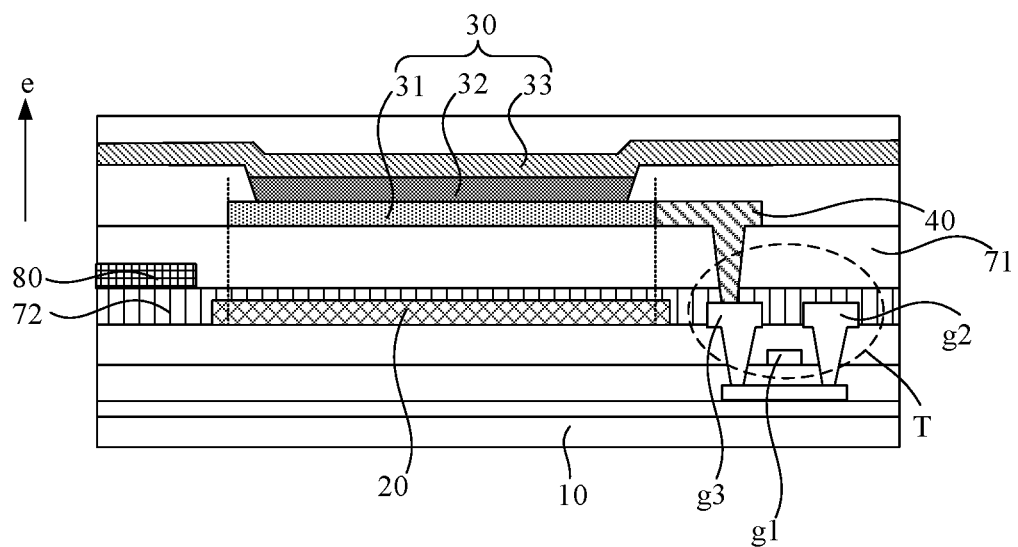
FIG. 14 is a schematic cross-sectional diagram of another display panel, according to an embodiment of the present disclosure.

In another embodiment, FIG. 14 is a schematic cross-sectional diagram of another display panel according to an embodiment of the present disclosure. As shown in FIG. 14, the display panel includes an inorganic insulating layer 72 and an organic insulating layer 71, the inorganic insulating layer 72 is in contact with the metal part 20 and covers the metal part 20, and the organic insulating layer 71 is in contact with the inorganic insulating layer 72 and covers the inorganic insulating layer 72. That is, an inorganic insulating layer 72 and an organic insulating layer 71 are provided above the metal part 20. A transistor T in the pixel circuit is further shown in the figure. The transistor T includes a gate g1, a source g2, and a drain g3. The first electrode 31 of the light-emitting element 30 is electrically connected to the drain g3 of the transistor T3 through the connecting electrode 40. A metal structure 80 is further shown in the figure. The metal structure 80 is disposed at a side of the inorganic insulating layer 72 facing away from the substrate 10. That is, the metal part 80 is formed after the process of the inorganic insulating layer 70. In the light-exiting direction e of the display panel, the metal structure 80 does not overlap with the first electrode 31.

FIG. 14 shows that the metal 20 is in the same layer as the source and the drain of the transistor T. For example, during the formation of the display panel, the metal part 20 as well as the source g2 and the drain g3 are formed in the same process. A whole-surface inorganic insulating layer 72 is formed after the process of the metal part 20, the inorganic insulating layer 72 contacts and covers the metal part 20, and the inorganic insulating layer 72 is etched to form a through-hole (not marked in the figure) to expose the drain g3. Then, the metal structure 80 is formed above the inorganic insulating layer 72, and the formed metal structure 80 bypasses a region where the metal part 20 is disposed, so that the metal structure 80 will not cause the surface above the metal part 20 to be non-flat. Then the organic insulating layer 71 is formed after the process of the metal structure 80, wherein the organic insulating layer 71 has functions of insulation and planarization. Then, the organic insulating layer 71 is etched to form a through-hole to expose the drain g3. That is, the through-hole of the inorganic insulating layer 72 and the through-hole of the organic insulating layer 71 above the drain g3 are interconnected to expose the drain g3. Then, the first electrode 31 is formed above the organic insulating layer 71. The first electrode 31 is formed above the metal part 20. The inorganic insulating layer 72 and the organic insulating layer 71 formed above the large-area metal part 20 are also relatively flat, so as to provide a relatively flat base for the first electrode 31, so that the flatness of the formed first electrode 31 is better, which can alleviate color dispersion of the display panel in a dark state, and can also alleviate the problem of color deviation at large viewing angles of the display panel. In addition, during the formation of the first electrode 31, the connecting electrode 40 is formed in the same process. The connecting electrode 40 and the first electrode 31 may be integrally formed, and the connecting electrode 40 is connected to the drain g3 below via the through-hole.

In one embodiment, the metal structure 80 in the embodiment of FIG. 14 may be a signal line in the display panel. For example, the metal structure 80 may be electrically connected to a signal line disposed in a different metal layer to form double-layer metal wiring, thereby reducing the overall resistance of the signal line, reducing the voltage drop loss during the transmission of voltage signals on the signal line and reducing the power consumption of the display panel during the operation of the display panel.

Figure 15:
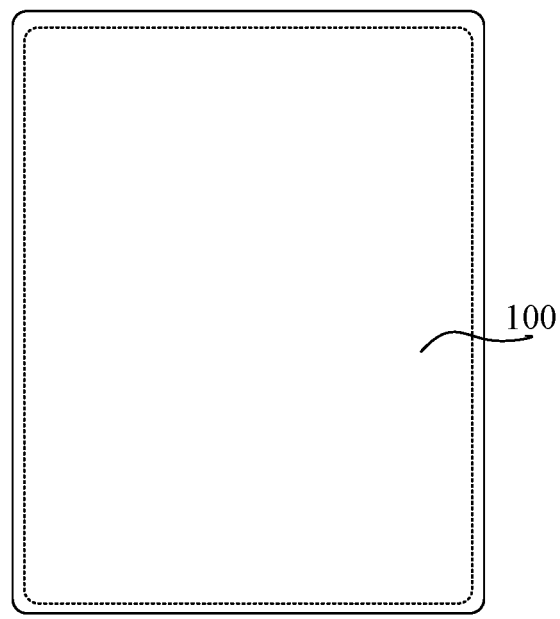
FIG. 15 is a schematic diagram of a display device, according to an embodiment of the present disclosure.

An embodiment of the present disclosure further provides a display device. FIG. 15 is a schematic diagram of a display device according to an embodiment of the present disclosure. As shown in the figure, the display device includes the display panel 100 according to any embodiment of the present disclosure. The structure of the display panel 100 has been described in the embodiments of the display panel, and is not repeated herein. In the embodiments of the present disclosure, the display device may be, for example, any device with a display function, such as a mobile phone, a tablet computer, a notebook computer, an e-book, a TV, or a smart wearable product.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising:
   a substrate;
   a plurality of metal parts disposed at a side of the substrate;
   a plurality of light-emitting elements disposed at a side of the plurality of metal parts facing away from the substrate, wherein each light-emitting element of the plurality of light-emitting elements comprises a first electrode, a light-emitting portion, and a second electrode;
   a plurality of thin film transistors, wherein one thin film transistor of the plurality of thin film transistors comprises a drain, a source, and an active layer, wherein one metal part of the plurality of metal parts is located at a side of at least one of the source or the drain of the one thin film transistor facing light-emitting elements of the plurality of light-emitting elements; and a connecting electrode, wherein one light-emitting element of the plurality of light-emitting elements is connected to the one thin film transistor through the connecting electrode, and at least a part of the connecting electrode does not overlap with the one metal part in a direction perpendicular to a plane where the substrate is disposed;

wherein the one metal part of the plurality of metal parts overlaps with a respective first electrode in the direction perpendicular to the plane where the substrate is disposed; in a cross section of the display panel that is perpendicular to the plane where the substrate is disposed and passes through both the one metal part and the respective first electrode, the one metal part comprises a first end and a second end along a first direction parallel to the plane where the substrate is disposed, the respective first electrode comprises a third end and a fourth end along the first direction from the first end to the second end of the one metal part, and a distance between the first end and the second end along the first direction is smaller than a distance between the first end to the fourth end along the first direction, and the distance between the first end and the second end along the first direction is smaller than a distance between the second end to the third end along the first direction; and in another cross section of the display panel that is perpendicular to the plane where the substrate is disposed and passes through both the one metal part and the respective first electrode, the one metal part further comprises a fifth end and a sixth end along a second direction parallel to the plane where the substrate is disposed, the respective first electrode further comprises a seventh end and an eighth end along the second direction from the fifth end to the sixth end of the one metal part, and a distance between the fifth end and the sixth end along the second direction is smaller than a distance between the fifth end and the eighth end along the second direction, and the distance between the fifth end and the sixth end along the second direction is smaller than a distance between the sixth end and the seventh end along the second direction, the first direction and the second direction intersecting with each other and both being parallel to the plane where the substrate is disposed.

2. The display panel according to claim 1, further comprising a color filter layer disposed at a side of light-emitting elements of the plurality of light-emitting elements facing away from the substrate, wherein the color filter layer comprises a plurality of filter units and a light-blocking part, wherein the light-blocking part defines a plurality of first apertures, and a projection of each filter unit of the plurality of filter units in a plane where the light-blocking part is disposed covers a respective first aperture of the plurality of first apertures; and wherein in the light-exiting direction of the display panel, each first aperture overlaps with a respective light-emitting element of the plurality of light-emitting elements, and a projection of each metal part of the plurality of metal parts on the color filter layer covers a respective first aperture of the plurality of first apertures.

3. The display panel according to claim 2, wherein in the light-exiting direction of the display panel, a projection of each first electrode on the color filter layer is disposed in a respective first aperture.

4. The display panel according to claim 2, further comprising a pixel defining layer comprising a plurality of second apertures, wherein each second aperture of the plurality of second apertures exposes a respective first electrode, and each light-emitting portion is disposed in a respective second aperture of the plurality of second apertures; and wherein the pixel-defining layer comprises a light-transmitting material.

5. The display panel according to claim 1, further comprising a color filter layer disposed on a side of the plurality of light-emitting elements facing away from the substrate, wherein the color filter layer comprises a plurality of filter units and a light-blocking part, wherein the light-blocking part defines a plurality of first apertures, and wherein a projection of each filter unit of the plurality of filter units in a plane where the light-blocking part is disposed covers a respective first aperture of the plurality of first apertures; and wherein in the light-exiting direction of the display panel, each first aperture overlaps with a respective light-emitting element of the plurality of light-emitting elements, and an orthographic projection of each first electrode on the color filter layer covers a respective first aperture of the plurality of first apertures.

6. The display panel according to claim 5, further comprising a pixel defining layer comprising a plurality of second apertures, wherein each second aperture of the plurality of second apertures exposes a respective first electrode, and each light-emitting portion is disposed in a respective second aperture of the plurality of second apertures; and wherein the pixel-defining layer comprises a light-transmitting material.

7. The display panel according to claim 1, further comprising a pixel-defining layer comprising a plurality of second apertures, wherein each second aperture of the plurality of second apertures exposes a respective first electrode, and wherein each light-emitting portion is disposed in a respective second of the plurality of second apertures; and the pixel-defining layer comprises a light-blocking material.

8. The display panel according to claim 7, wherein a non-right angle is formed between a side wall of each second aperture of the plurality of second apertures and the plane where the substrate is disposed, and wherein an orthographic projection of each first electrode on the substrate covers an orthographic projection of a respective side wall on the substrate.

9. The display panel according to claim 7, wherein a non-right angle is formed between a side wall of each second aperture of the plurality of second apertures and the plane where the substrate is disposed, and the orthographic projection of each metal part of the plurality of metal parts on the substrate covers an orthographic projection of a respective side wall on the substrate.

10. The display panel according to claim 1, wherein a shape of each metal part of the plurality of metal parts is the same as a shape of a respective first electrode.

11. The display panel according to claim 1, further comprising a first metal layer and a second metal layer that are disposed above the substrate, wherein a thickness of the second metal layer is greater than a thickness the first metal layer; and wherein the plurality of metal parts is disposed in the second metal layer.

12. The display panel according to claim 1, further comprising at least two metal layers disposed between the substrate and the plurality of light-emitting elements, wherein the plurality of metal parts is disposed in a metal layer closest to the plurality of light-emitting elements in the light-exiting direction of the display panel.

13. The display panel according to claim 12, further comprising an organic insulating layer contacting and covering the plurality of metal parts.

14. The display panel according to claim 13, further comprising an inorganic insulating layer and an organic insulating layer, wherein the inorganic insulating layer contacts and covers the plurality of metal parts, and wherein the organic insulating layer contacts and covers the inorganic insulating layer.

15. The display panel according to claim 1, wherein
the plurality of metal parts is not connected to an electric potential.

16. The display panel according to claim 1, wherein
the plurality of metal parts is further configured for use as a signal line in the display panel.

17. The display panel according to claim 1, further comprising a metal structure not overlapping with any respective first electrode in a direction perpendicular to a plane where the substrate is disposed,
wherein one metal part of the plurality of metal parts overlaps with a respective first electrode in the direction perpendicular to a plane where the substrate is disposed; and a layer where the metal structure is located is disposed between a layer where the first electrode is located and a layer where the metal part is located.

18. A display device, comprising a display panel, wherein the display panel comprise:
a substrate;
a plurality of metal parts disposed at a side of the substrate;
a plurality of light-emitting elements disposed at a side of the plurality of metal parts facing away from the substrate, wherein each light-emitting element of the plurality of light-emitting elements comprises a first electrode, a light-emitting portion, and a second electrode;
a plurality of thin film transistors, wherein one thin film transistor of the plurality of thin film transistors comprises a drain, a source, and an active layer, wherein one metal part of the plurality of metal parts is located at a side of at least one of the source or the drain of the one thin film transistor facing light-emitting elements of the plurality of light-emitting elements; and
a connecting electrode, wherein one light-emitting element of the plurality of light-emitting elements is connected to the one thin film transistor through the connecting electrode, and at least a part of the connecting electrode does not overlap with the one metal part in a direction perpendicular to a plane where the substrate is disposed;
wherein the one metal part of the plurality of metal parts overlaps with a respective first electrode in the direction perpendicular to the plane where the substrate is disposed; in a cross section of the display panel that is perpendicular to the plane where the substrate is disposed and passes through both the one metal part and the respective first electrode, the one metal part comprises a first end and a second end along a first direction parallel to the plane where the substrate is disposed, the respective first electrode comprises a third end and a fourth end along the first direction from the first end to the second end of the one metal part, and a distance between the first end and the second end along the first direction is smaller than a distance between the first end to the fourth end along the first direction, and the distance between the first end and the second end along the first direction is smaller than a distance between the second end to the third end along the first direction; and in another cross section of the display panel that is perpendicular to the plane where the substrate is disposed and passes through both the one metal part and the respective first electrode, the one metal part further comprises a fifth end and a sixth end along a second direction parallel to the plane where the substrate is disposed, the respective first electrode further comprises a seventh end and an eighth end along the second direction from the fifth end to the sixth end of the one metal part, and a distance between the fifth end and the sixth end along the second direction is smaller than a distance between the fifth end and the eighth end along the second direction, and the distance between the fifth end and the sixth end along the second direction is smaller than a distance between the sixth end and the seventh end along the second direction, the first direction and the second direction intersecting with each other and both being parallel to the plane where the substrate is disposed.

19. The display device according to claim 18, further comprising a color filter layer disposed at a side of the plurality of light-emitting elements facing away from the substrate, wherein the color filter layer comprises a plurality of filter units and a light-blocking part, wherein the light-blocking part defines a plurality of first apertures, and wherein a projection of each filter unit of the plurality of filter units in a plane where the light-blocking part is disposed covers a respective first aperture of the plurality of first apertures; and
wherein in the light-exiting direction of the display panel, each first aperture overlaps with a respective light-emitting element of the plurality of light-emitting elements, and wherein a projection of each metal part of the plurality of metal parts on the color filter layer covers a respective first aperture of the plurality of first apertures, and/or an orthographic projection of each first electrode on the color filter layer covers a respective first aperture of the plurality of first apertures.

* * * * *

UNITED STATES PATENT AND TRADEMARK OFFICE
CERTIFICATE OF CORRECTION

PATENT NO. : 12,408,532 B2
APPLICATION NO. : 17/333936
DATED : September 2, 2025
INVENTOR(S) : Linshan Guo et al.

Page 1 of 1

It is certified that error appears in the above-identified patent and that said Letters Patent is hereby corrected as shown below:

In the Claims

| Column | Line | |
|---|---|---|
| 15 | 15 | Claim 1 delete "first" and insert -- third -- |
| 15 | 15 | Claim 1 delete "second" and insert -- fourth -- |
| 15 | 17 | Claim 1 delete "third" and insert -- first -- |
| 15 | 18 | Claim 1 delete "fourth" and insert -- second -- |
| 15 | 18 | Claim 1 delete "first" and insert -- third -- |
| 15 | 19 | Claim 1 delete "second" and insert -- fourth -- |
| 15 | 30 | Claim 1 delete "fifth" and insert -- seventh -- |
| 15 | 30 | Claim 1 delete "a sixth" and insert -- an eighth -- |
| 15 | 33 | Claim 1 delete "seventh" and insert -- fifth -- |
| 15 | 33 | Claim 1 delete "an eighth" and insert -- a sixth -- |
| 15 | 34 | Claim 1 delete "fifth" and insert -- seventh -- |
| 15 | 34 | Claim 1 delete "sixth" and insert -- eighth -- |

Signed and Sealed this
Third Day of February, 2026

John A. Squires
*Director of the United States Patent and Trademark Office*